United States Patent
Tsai et al.

(10) Patent No.: US 8,418,750 B2
(45) Date of Patent: Apr. 16, 2013

(54) HEAT EXCHANGER RADIATING FIN STRUCTURE AND HEAT EXCHANGER THEREOF

(75) Inventors: Ching-Hsien Tsai, Sinjhuang (TW); Li-Dong Zhang, Sinjhuang (TW)

(73) Assignee: Asia Vital Components Co., Ltd., Taipei County (TW)

( * ) Notice: Subject to any disclaimer, the term of this patent is extended or adjusted under 35 U.S.C. 154(b) by 480 days.

(21) Appl. No.: 12/700,731

(22) Filed: Feb. 5, 2010

(65) Prior Publication Data

US 2011/0120689 A1 May 26, 2011

(30) Foreign Application Priority Data

Nov. 25, 2009 (TW) .............................. 098222045 U

(51) Int. Cl.
*F28F 7/00* (2006.01)
*F28F 13/12* (2006.01)
*F28F 3/00* (2006.01)

(52) U.S. Cl.
USPC ................ 165/80.3; 165/166; 165/109.1

(58) Field of Classification Search ............ 165/185, 165/179, 166, 109.1
See application file for complete search history.

(56) References Cited

U.S. PATENT DOCUMENTS

| 1,826,344 | A | * | 10/1931 | Dalgliesh | 165/170 |
|---|---|---|---|---|---|
| 2,306,526 | A | * | 12/1942 | Dalzell et al. | 29/890.042 |
| 4,569,391 | A | * | 2/1986 | Hulswitt et al. | 165/166 |
| 5,377,746 | A | * | 1/1995 | Reid et al. | 165/184 |
| 5,832,993 | A | * | 11/1998 | Ohata et al. | 165/166 |
| 6,589,600 | B1 | * | 7/2003 | Hasz et al. | 427/264 |
| 6,808,017 | B1 | * | 10/2004 | Kaellis | 165/159 |
| 6,886,816 | B2 | * | 5/2005 | Smith et al. | 261/112.1 |
| 6,920,918 | B2 | * | 7/2005 | Knecht et al. | 165/157 |
| 7,267,165 | B2 | * | 9/2007 | Shin et al. | 165/166 |
| 2004/0182556 | A1 | * | 9/2004 | Jahn et al. | 165/166 |
| 2006/0260791 | A1 | * | 11/2006 | Lee et al. | 165/166 |
| 2008/0023180 | A1 | * | 1/2008 | Bunker et al. | 165/109.1 |

* cited by examiner

*Primary Examiner* — Allen J. Flanigan
*Assistant Examiner* — Jason Thompson

(57) ABSTRACT

A heat exchanger radiating fin structure and a heat exchanger thereof. The radiating fin includes a main body and at least one rib. The main body has a first plane face and at least one lateral side. Multiple depressions are formed on the first plane face. The rib is disposed on a portion of the first plane face, which portion is free from any of the depressions. The rib obliquely extends in a direction neither normal nor parallel to any lateral side of the first plane face. The heat exchanger includes a radiating fin assembly composed of multiple piled up radiating fins. Each two adjacent radiating fins define therebetween a flow way having at least one inlet and at least one outlet. With the depressions and the rib, the structural strength of the radiating fin is increased and the heat exchange performance of the heat exchanger is enhanced.

9 Claims, 7 Drawing Sheets

HEAT EXCHANGER RADIATING FIN STRUCTURE AND HEAT EXCHANGER THEREOF

This application claims the priority benefit of Taiwan patent application number 098222045 filed on Nov. 25, 2009.

FIELD OF THE INVENTION

The present invention relates to a heat exchanger radiating fin structure and a heat exchanger thereof. The radiating fin is formed with multiple depressions and at least one reinforcing rib for enhancing heat exchange performance of the heat exchanger and increasing structural strength of the radiating fin.

BACKGROUND OF THE INVENTION

It is known that when an electronic product or equipment operates at high speed, the chips or electronic components of the electronic product or equipment at the same time generates high heat. The heat will accumulate inside the electronic equipment to deteriorate the operation efficiency thereof. Therefore, it is necessary to arrange a thermal module in the electronic equipment to dissipate the heat generated by the chips. In some cases, a heat exchanger is further mounted in the electronic equipment to circulate the air inside and outside the electronic equipment so as to more efficiently dissipate the heat out of the electronic equipment.

As shown in FIG. 7, a conventional heat exchanger 20 has multiple radiating fins, which together define multiple heat dissipation flow ways 22. The hot air enters the heat exchanger 20 and becomes cold air by means of heat exchange. The cold air is then exhausted from the heat exchanger 20 to complete a thermal cycle.

The radiating fins of the conventional heat exchanger are piled up to save material cost and achieve better heat exchange efficiency. The radiating fins have a very thin thickness and thus a relatively weak structural strength. When assembled or installing the heat exchanger, the radiating fins are often incautiously damaged due to collision. As a result, the ratio of defective products is high.

SUMMARY OF THE INVENTION

A primary object of the present invention is to provide a heat exchanger radiating fin structure and a heat exchanger thereof. The radiating fin has higher structural strength and the heat exchanger has higher heat exchange performance.

To achieve the above and other objects, the heat exchanger radiating fin structure includes a main body and at least one rib. The main body has a first plane face and at least one lateral side. Multiple depressions are formed on the first plane face. The rib is disposed on a portion of the first plane face, which portion is free from any of the depressions. The rib obliquely extends in a direction neither normal nor parallel to any lateral side of the first plane face. The heat exchanger includes a radiating fin assembly composed of multiple piled up radiating fins. Each two adjacent radiating fins define therebetween a flow way having at least one inlet and at least one outlet. With the depressions and the rib, the structural strength of the radiating fin is increased and the heat exchange performance of the heat exchanger is enhanced.

According to the above, the present invention has the following advantages:

1. The heat exchange performance of the heat exchanger is enhanced.
2. The structural strength of the radiating fin is increased.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
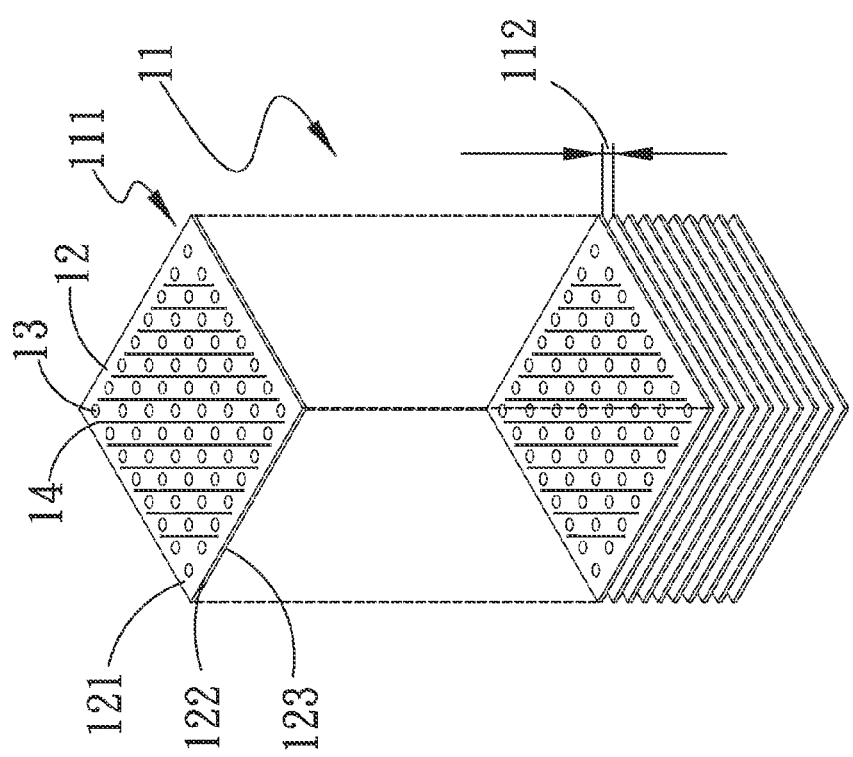
FIG. 1 is a perspective exploded view of the radiating fin assembly of the present invention.
Figure 2:
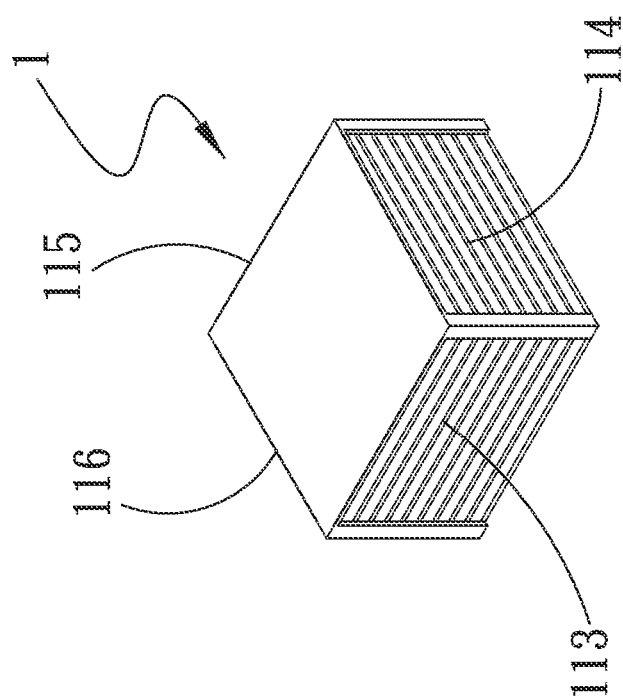
FIG. 2 is a perspective assembled view of the heat exchanger of the present invention.
Figure 3:
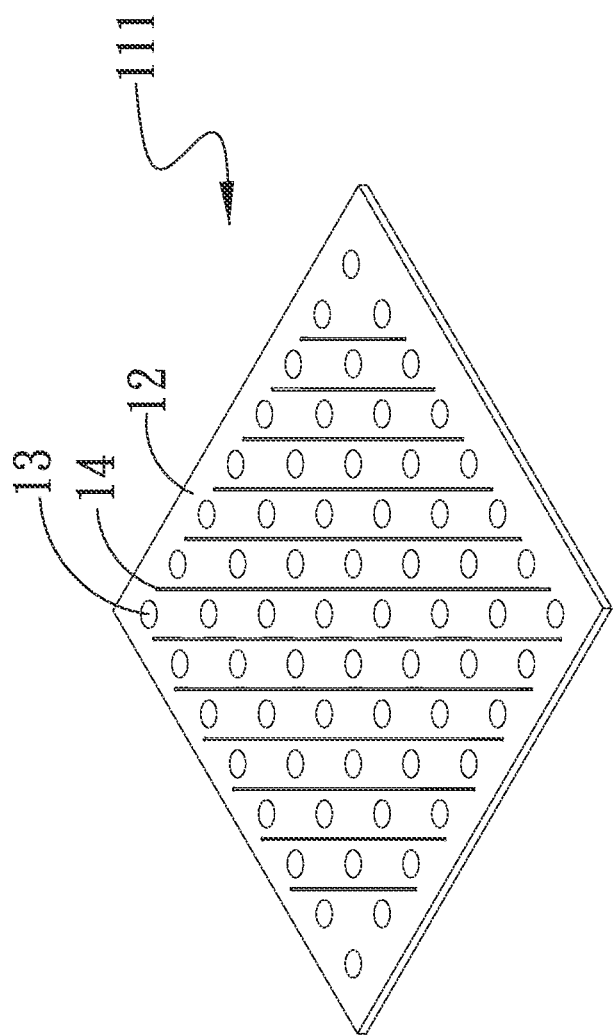
FIG. 3 is a perspective view of the heat exchanger radiating fin of the present invention.

Please refer to FIGS. 1, 2 and 3, in which FIG. 1 is a perspective exploded view of the radiating fin assembly of the present invention, FIG. 2 is a perspective assembled view of the heat exchanger of the present invention, while FIG. 3 is a perspective view of the heat exchanger radiating fin of the present invention. The heat exchanger 1 of the present invention includes a radiating fin assembly 11 composed of multiple radiating fins 111 arranged at intervals in parallel to each other. Each two adjacent radiating fins 111 define therebetween a flow way 112. The flow way 112 has a first inlet 113, a second inlet 114, a first outlet 115 and a second outlet 116 on four sides of the radiating fin assembly 11 respectively. The first inlet 113 is opposite to the first outlet 115, while the second inlet 114 is opposite to the second outlet 116.

Each radiating fin 111 has a main body 12, multiple depressions 13 and at least one rib 14.

The main body 12 has a first plane face 121 and at least one lateral side 122. The depressions 13 are formed on the first plane face 121.

Figure 4:
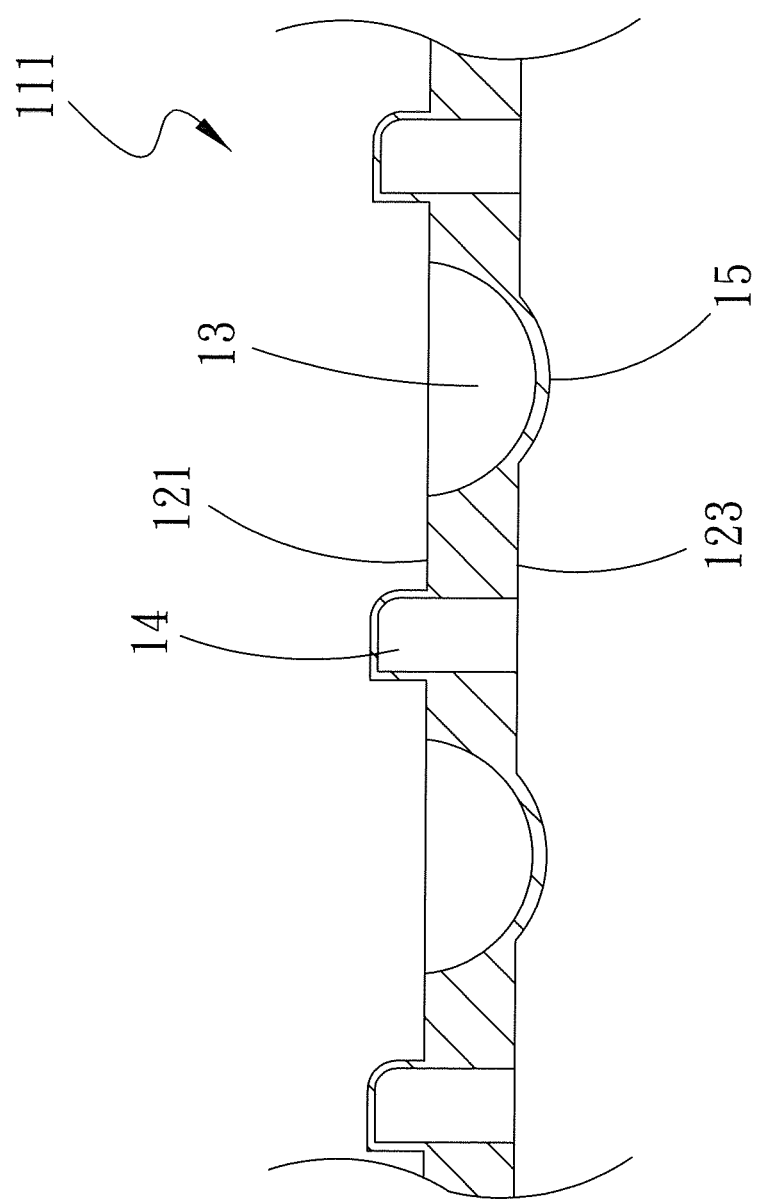
FIG. 4 is a sectional view of the heat exchanger radiating fin of the present invention.
Figure 5:
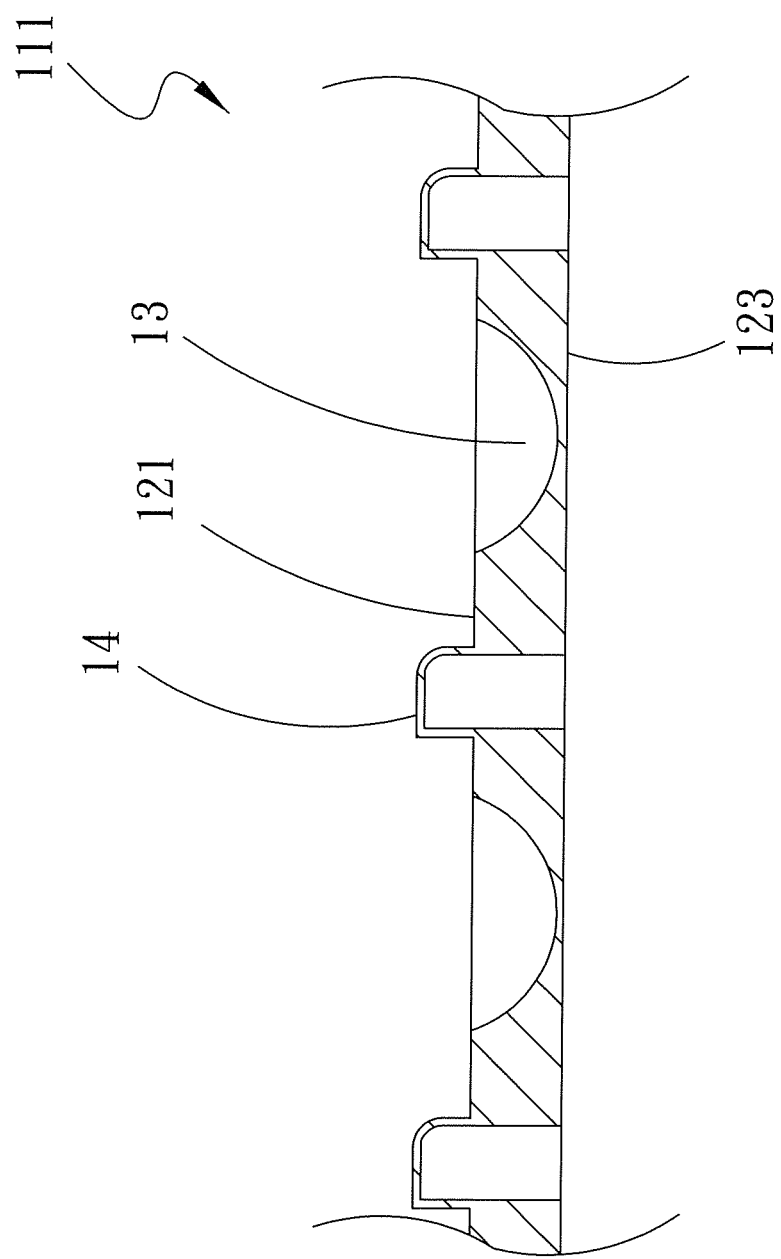
FIG. 5 is a sectional view of another embodiment of the heat exchanger radiating fin of the present invention.

The main body 12 further has a second plane face 123 opposite to the first plane face 121. The depressions 13 are recessed from the first plane face 121 to the second plane face 123 without penetrating through the main body 12. Accordingly, multiple bosses 15 corresponding to the depressions 13 can be formed on those portions of the second plane face 123 that are behind the depressions 13 (as shown in FIG. 4). Alternatively, the portions of the second plane face 123 behind the depressions 13 can remain plane (as shown in FIG. 5).

The rib 14 is disposed on a portion of the first plane face 121, which portion is free from any of the depressions 13. The rib 14 obliquely extends in a direction neither normal nor parallel to any lateral side 122 of the first plane face 121.

Figure 6:
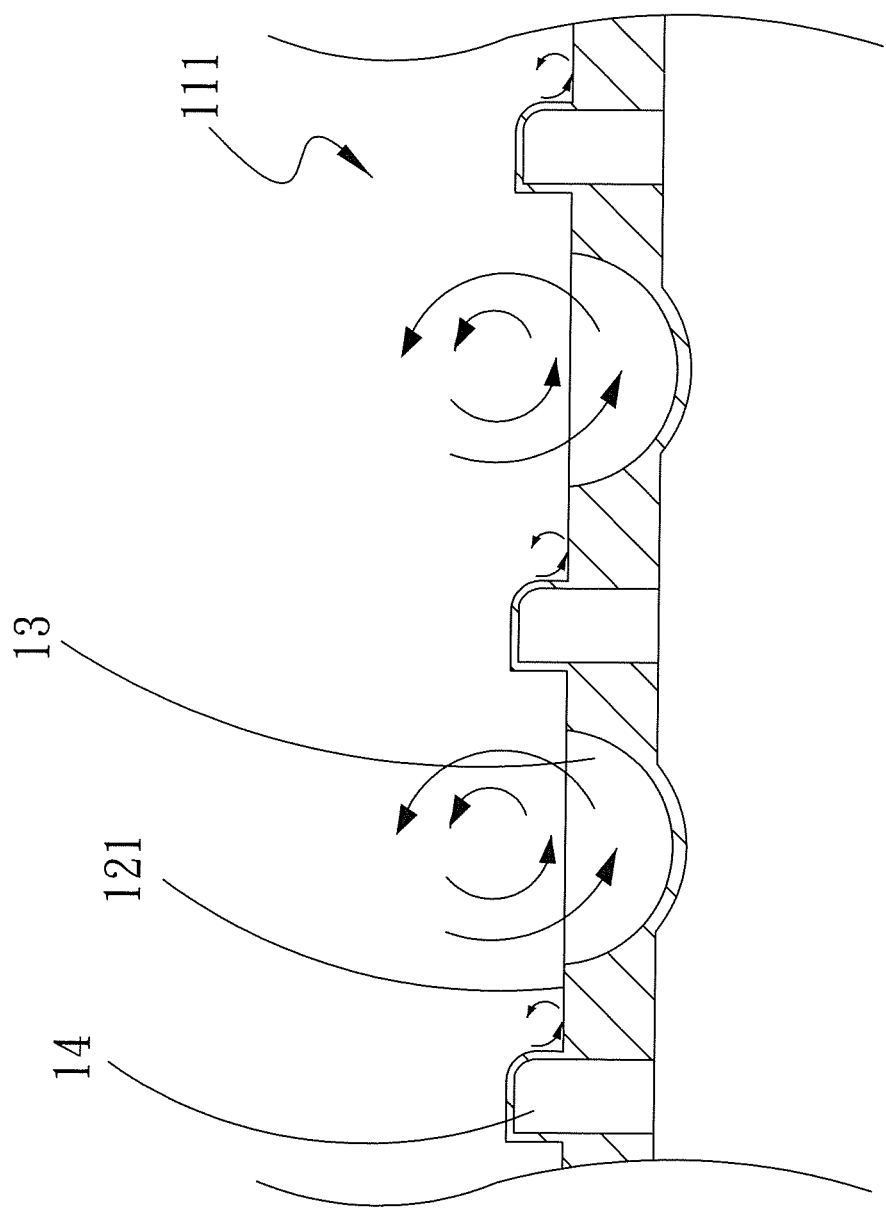
FIG. 6 is a sectional view of the heat exchanger radiating fin of the present invention, showing the path of the fluid flowing through the radiating fin.
Figure 7:
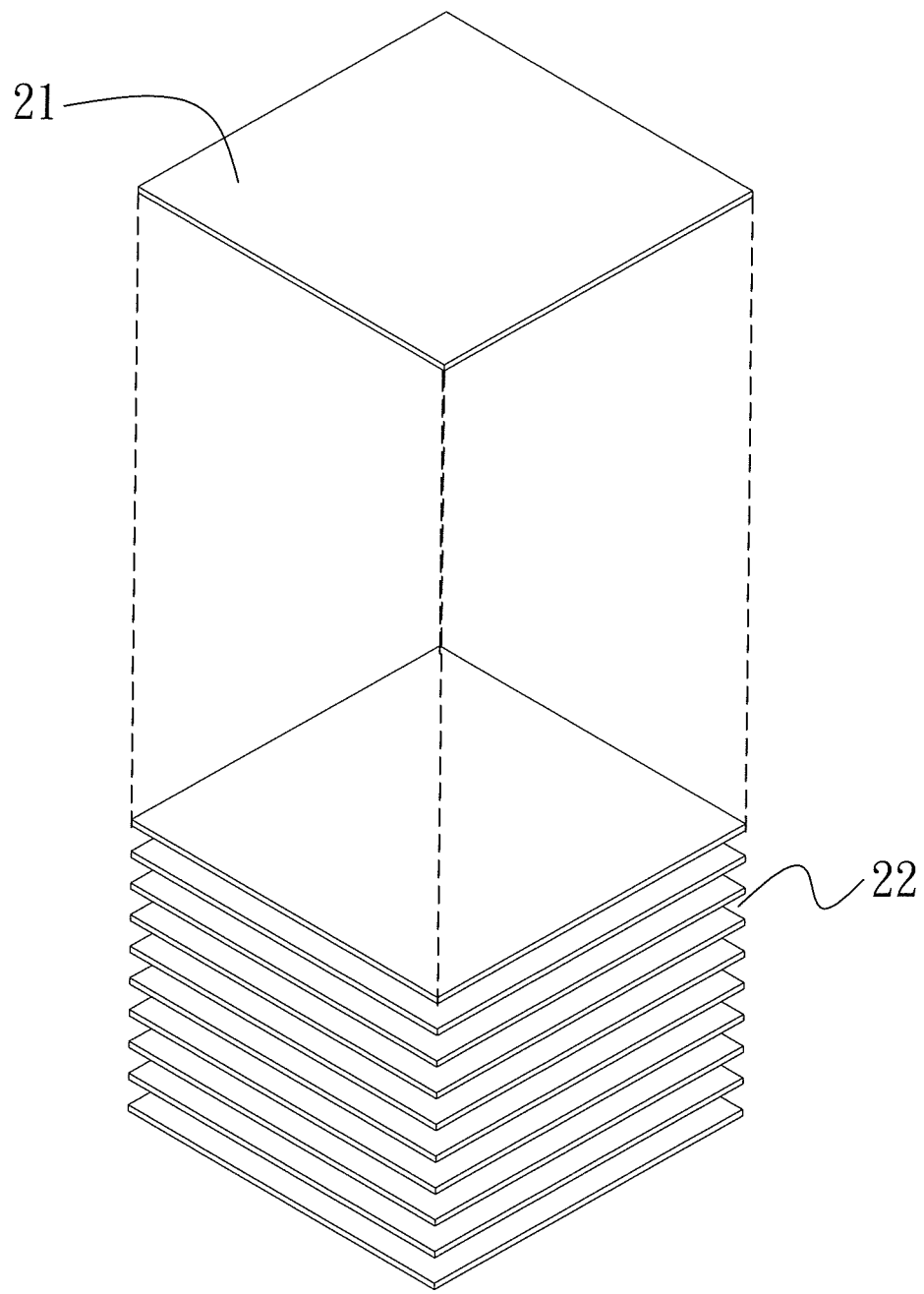
FIG. 7 is a perspective assembled view of the heat exchanger of a conventional prior invention.

The rib 14 protrudes from the first plane face 121, the rib having a top portion, a front edge and a rear edge, wherein the front edge of each rib is formed substantially at a right angle to said top portion and the rear edge of the rib is formed as an arcuate section from the top portion to the first plane face as shown in FIG. 6.

The rib 14 is additionally formed on the main body 12 of the radiating fin 111 to increase the structural strength thereof. Therefore, when piled up and assembled, the radiating fins 111 will not collapse due to gravity.

Please now refer to FIG. 6, which is a sectional view of the heat exchanger radiating fin of the present invention, showing the path of the fluid flowing through the radiating fin 111. As shown in FIG. 6, when the fluid flows through the surfaces of the depressions 13 formed on the first plane face 121 of the radiating fin 111, the pressure gradient of the flow field will change to create mushroom-shaped or eddy-like eddy flow normal to the surfaces of the depressions 13. Accordingly, a flow field with enhanced thermal convection and thermal conductivity is produced.

Moreover, the rib 14 formed on the first plane face 121 of the radiating fin 111 not only serves to increase the structural strength of the radiating fin 111, but also is able to guide the ascending airflow of the heat exchanger 1.

The separation eddy produced on front edge of the rib 14 serves to promote the turbulence intensity of the flow field. The eddy behind the rib 14 pertains to dynamic eddy and is able to enhance heat conduction performance. Also, the shear layer of outer periphery of the eddy behind the rib 14 is able to increase the turbulence intensity of the flow field. Accordingly, by means of forming the rib 14 on the first plane face 121, the thermal convection coefficient of the radiating fin 111 can be increased.

The present invention has been described with some preferred embodiments thereof and it is understood that many changes and modifications in the described embodiments can be carried out without departing from the spirit of the present invention. For example, the configurations or layouts of the radiating fin and heat exchanger of the present invention can be varied to achieve equivalent effect. The scope of the present invention is intended to be limited only by the appended claims.

What is claimed is:

1. A heat exchanger radiating fin structure comprising:
a main body having a first plane face and at least one lateral side, multiple depressions being formed on the first plane face; and
at least one rib disposed on a portion of the first plane face, which portion is free from any of the depressions, the at least one rib obliquely extending in one direction neither normal nor parallel to any lateral side of the first plane face;
wherein the at least one rib has a top portion, a front edge and a rear edge, wherein the front edge of each rib is formed substantially at a right angle to said top portion and the rear edge of the rib is formed as an arcuate section from the top portion to the first plane face.

2. The heat exchanger radiating fin structure as claimed in claim 1, wherein the main body further has a second plane face opposite to the first plane face, the depressions being recessed from the first plane face to the second plane face.

3. The heat exchanger radiating fin structure as claimed in claim 2, wherein the second plane face including portions that are behind the depressions recessed from the first plane face is planar.

4. The heat exchanger radiating fin structure as claimed in claim 2, wherein multiple bosses corresponding to the depressions are formed on those portions of the second plane face that are behind the depressions.

5. The heat exchanger radiating fin structure as claimed in claim 2, wherein the rib protrudes from the first plane face.

6. A heat exchanger comprising:
a radiating fin assembly composed of multiple radiating fins arranged at intervals parallel to each other, each two adjacent radiating fins defining therebetween a flow way, such that three consecutive radiating fins define two consecutive flow ways the two flow ways defining a first inlet, a second inlet, a first outlet and a second outlet in the radiating fin assembly, respectively, the first inlet being opposite to the first outlet, while the second inlet is opposite to the second outlet, each radiating fin having a main body, the main body having a first plane face and at least one lateral side, multiple depressions being formed on the first plane face, each radiating fin further having at least one rib disposed on a portion of the first plane face, which portion is free from any of the depressions, the rib obliquely extending in one direction neither normal nor parallel to any lateral side of the first plane face;
wherein the at least one rib has a top portion, a front edge and a rear edge, wherein the front edge of each rib is formed substantially at a right angle to said top portion and the rear edge of the rib is formed as an arcuate section from the top portion to the the first plane face.

7. The heat exchanger as claimed in claim 6, wherein the main body further has a second plane face opposite to the first plane face, the depressions being recessed from the first plane face to the second plane face.

8. The heat exchanger as claimed in claim 7, wherein those portions of the second plane face that are behind the depressions are plane.

9. The heat exchanger as claimed in claim 7, wherein multiple bosses corresponding to the depressions are formed on those portions of the second plane face that are behind the depressions.

* * * * *